(12) United States Patent
Takeda (10) Patent No.: US 11,764,141 B2
(45) Date of Patent: Sep. 19, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Shun Takeda, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 15 days.

(21) Appl. No.: 17/465,488

(22) Filed: Sep. 2, 2021

(65) Prior Publication Data

US 2022/0336339 A1     Oct. 20, 2022

(30) Foreign Application Priority Data

Apr. 20, 2021  (JP) ................... 2021-070759

(51) Int. Cl.
*H01L 23/498*  (2006.01)
*H01L 23/552*  (2006.01)
*H01L 25/07*  (2006.01)

(52) U.S. Cl.
CPC .. *H01L 23/49844* (2013.01); *H01L 23/49822* (2013.01); *H01L 23/552* (2013.01); *H01L 25/072* (2013.01)

(58) Field of Classification Search
CPC ............ H01L 23/49822; H01L 25/072; H01L 23/5385
See application file for complete search history.

(56) References Cited

U.S. PATENT DOCUMENTS

| | | | |
|---|---|---|---|
| 8,546,926 | B2 | 10/2013 | Kawanami et al. |
| 10,008,411 | B2 | 6/2018 | Bayerer |
| 2012/0236500 | A1 | 9/2012 | Higuchi et al. |
| 2013/0258628 | A1 | 10/2013 | Kawanami |
| 2018/0233421 | A1 | 8/2018 | Bayerer |
| 2018/0240732 | A1* | 8/2018 | Tonedachi ............... H01L 24/48 |

FOREIGN PATENT DOCUMENTS

| | | |
|---|---|---|
| EP | 3349249 A2 | 7/2018 |
| JP | 2000031331 A | 1/2000 |
| JP | 4885046 B2 | 2/2012 |
| JP | 5678884 B2 | 3/2015 |

\* cited by examiner

*Primary Examiner* — Michele Fan
(74) *Attorney, Agent, or Firm* — Kim & Stewart LLP (57) ABSTRACT

A semiconductor device includes a first substrate, a second substrate spaced apart from the first substrate in a first direction, a first metal layer on the first substrate, a second metal layer on the first substrate and spaced apart from the first metal layer in a second direction, a first semiconductor element, and a second semiconductor element. The second substrate includes a main wiring and a signal wiring. The first semiconductor element includes a first electrode on the first metal layer, a second electrode connected to the main wiring, and a first gate electrode connected to the signal wiring. The second semiconductor element includes a third electrode on the second metal layer, a fourth electrode connected to the main wiring, and a second gate electrode connected to the signal wiring. During operation, current flows in wiring layers of the main wiring in opposite directions.

20 Claims, 5 Drawing Sheets

SEMICONDUCTOR DEVICE

CROSS-REFERENCE TO RELATED APPLICATION

This application is based upon and claims the benefit of priority from Japanese Patent Application No. 2021-070759, filed Apr. 20, 2021, the entire contents of which are incorporated herein by reference.

FIELD

Embodiments described herein relate generally to a semiconductor device.

BACKGROUND

In a power module of the related art, semiconductor elements are mounted on a substrate. Electrodes of the semiconductor elements are electrically connected to a circuit on the substrate with wiring made of thin metal wire, for example.

The wiring has an inductance (Ls), and when a current flows in the wiring, an electromotive force is induced. A surge voltage generated when the semiconductor device is turned off is represented by a product of a current change rate and the inductance. In accordance with an increase in switching speed, the current change rate increases, and accordingly, the surge voltage increases. When the surge voltage exceeds a predetermined voltage, the semiconductor elements may be damaged. For this reason, there is a need for decreasing the induced electromotive force.

As an example of decreasing the induced electromotive force, there is a method of opposing wirings where the current flows in reverse directions. However, when using a two-dimensional circuit formed on an insulated circuit board, countercurrents of the wirings produce an insufficient effect of canceling the induced electromotive force. Moreover, when the wirings are disposed on the single insulated circuit board, the semiconductor elements cannot be integrated at high density.

DETAILED DESCRIPTION

Embodiments provide a semiconductor device that can increase integration of semiconductor elements and can decrease an induced electromotive force during operation.

In general, according to one embodiment, a semiconductor device includes a first substrate, a second substrate, a first metal layer, a second metal layer, a first semiconductor element, a second semiconductor element, a first terminal, a second terminal, a third terminal, a first gate terminal, and a second gate terminal. The first metal layer is disposed on the first substrate. The second metal layer is disposed on the first substrate and spaced apart from the first metal layer. The second substrate is spaced apart from the first substrate in a first direction and includes a main wiring and a signal wiring. The main wiring includes a first wiring layer electrically connected to the first metal layer, a second wiring layer electrically connected to the second metal layer, a third wiring layer spaced apart from the first wiring layer and the second wiring layer, and a fourth wiring layer electrically connected to the third wiring layer. The signal wiring includes a first gate wiring layer on a level different from a level of the main wiring in the first direction, and a second gate wiring layer on a level different from the level of the main wiring in the first direction. The first semiconductor element is disposed on the first metal layer and includes a first electrode, a second electrode, and a first gate electrode. The first electrode is electrically connected to the first metal layer and disposed on a first surface of the first semiconductor element. The second electrode is electrically connected to the second wiring layer and disposed on a second surface of the first semiconductor element that is opposite to the first surface of the first semiconductor element. The first gate electrode is electrically connected to the first gate wiring layer and disposed on the second surface of the first semiconductor element. The second semiconductor element is disposed on the second metal layer and includes a third electrode, a fourth electrode, and a second gate electrode. The third electrode is electrically connected to the second metal layer and disposed on a first surface of the second semiconductor element. The fourth electrode is electrically connected to the fourth wiring layer and disposed on a second surface of the second semiconductor element that is opposite to the first surface of the second semiconductor element. The second gate electrode is electrically connected to the second gate wiring layer and disposed on the second surface of the second semiconductor element. The first terminal is electrically connected to the first wiring layer. The second terminal is electrically connected to the third wiring layer. The third terminal is electrically connected to the second metal layer. The first gate terminal is electrically connected to the first gate wiring layer. The second gate terminal is electrically connected to the second gate wiring layer.

Hereinafter, embodiments of the present disclosure will be described with reference to the accompanying drawings. For this description, common components are denoted with identical reference signs in all of the drawings. Dimensional ratios in the drawings are not limited to the illustrated ratios. It is noted that the embodiments are not intended to limit the scope of the present disclosure.

First Embodiment

Configuration of Semiconductor Device 100

Figure 1A:
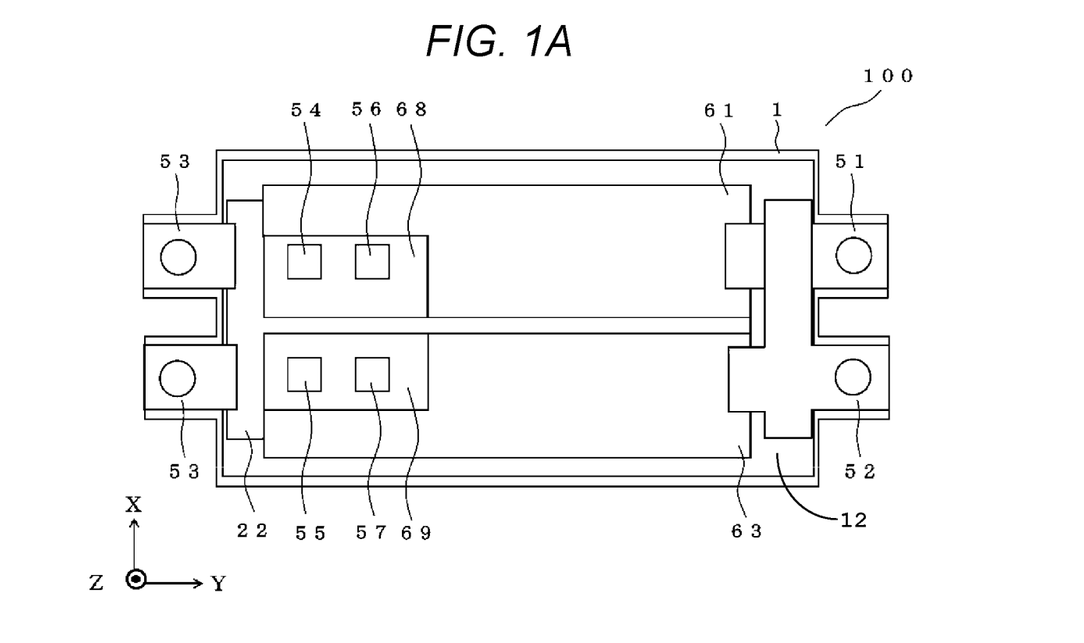
FIGS. 1A and 1B are each a plan view of a semiconductor device according to a first embodiment.
Figure 1B:
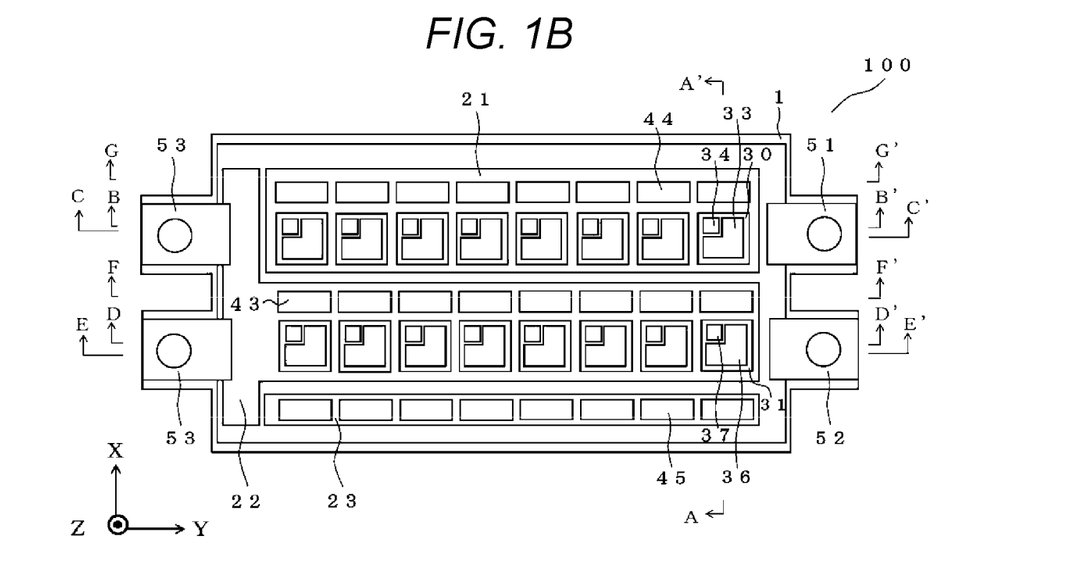

A detailed configuration of a semiconductor device 100 according to a first embodiment will be described with reference to FIGS. 1A, 1B, 2A to 2C, 3A to 3D, and 4. FIGS. 1A and 1B are each a plan view of the semiconductor device 100 according to the first embodiment. FIG. 1B illustrates upper surfaces of a first semiconductor element 30 and a second semiconductor element 31, with a second substrate 12 of FIG. 1A made transparent.

Figure 2A:
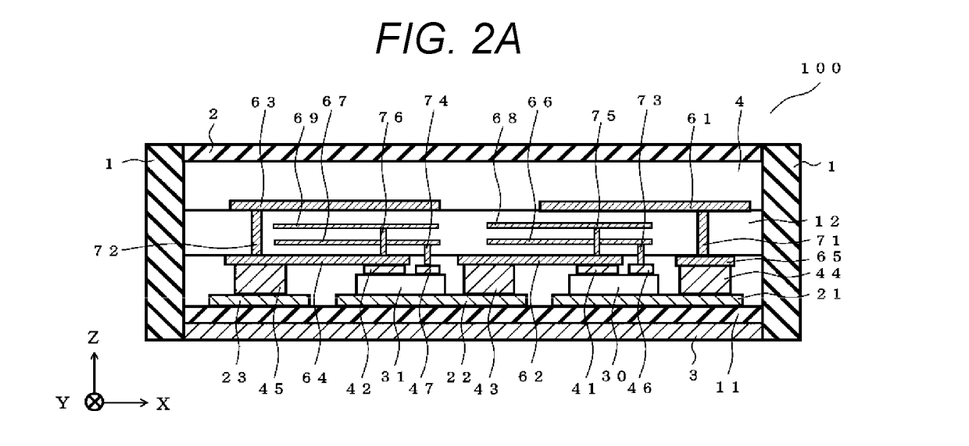
FIG. 2A is a cross-sectional view taken along line A-A' in FIG. 1B.
Figure 2B:
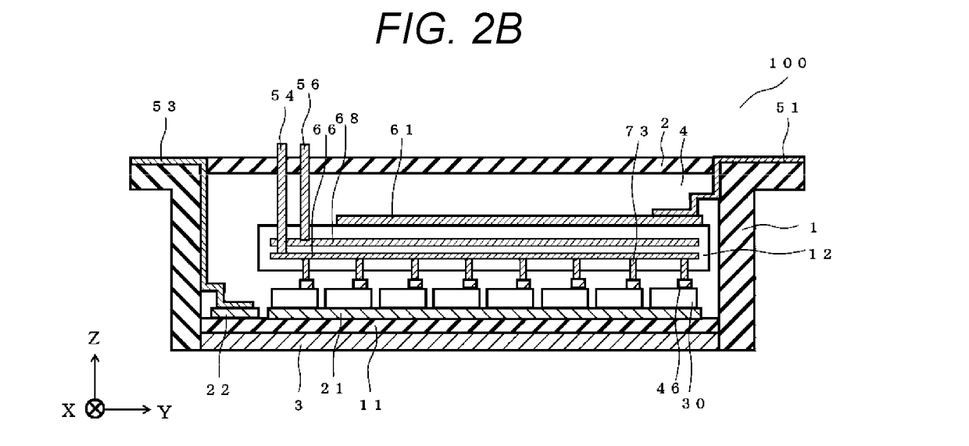
FIG. 2B is a cross-sectional view taken along line B-B' in FIG. 1B.
Figure 2C:
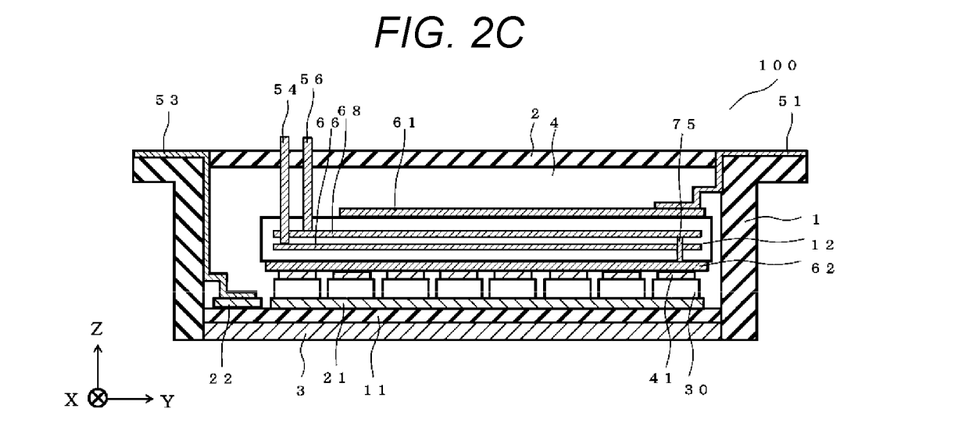
FIG. 2C is a cross-sectional view taken along line C-C' in FIG. 1B
Figure 3A:
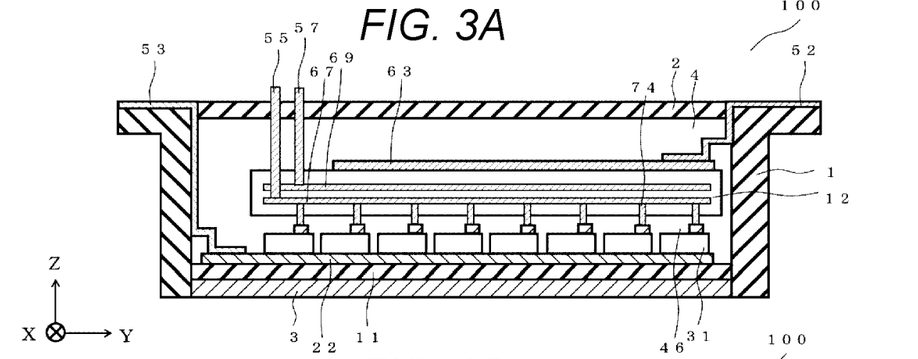
FIG. 3A is a cross-sectional view taken along line D-D' in FIG. 1B.
Figure 3B:
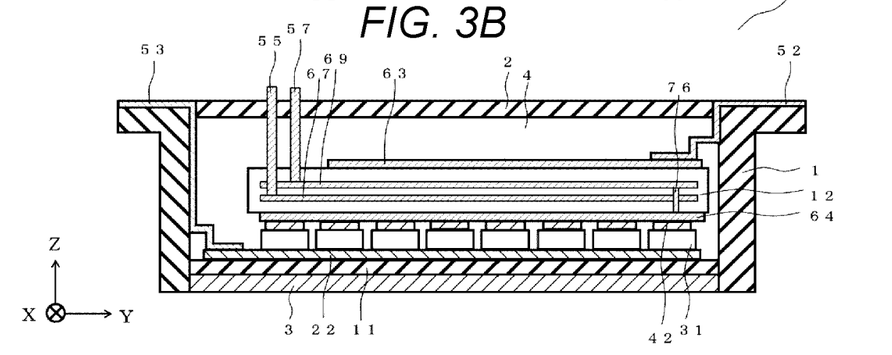
FIG. 3B is a cross-sectional view taken along line E-E' in FIG. 1B.
Figure 3C:
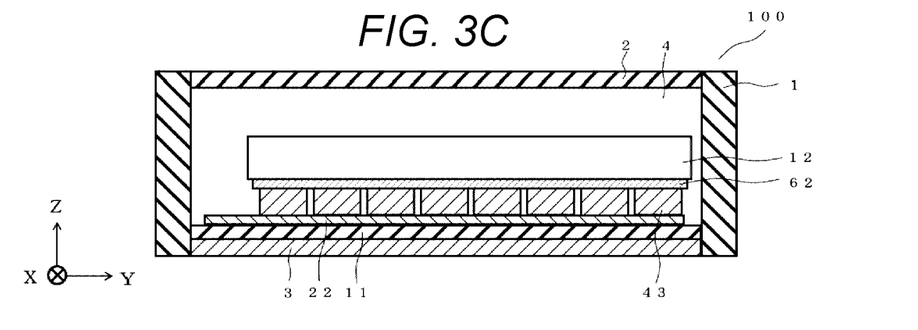
FIG. 3C is a cross-sectional view taken along line F-F' in FIG. 1B.
Figure 3D:
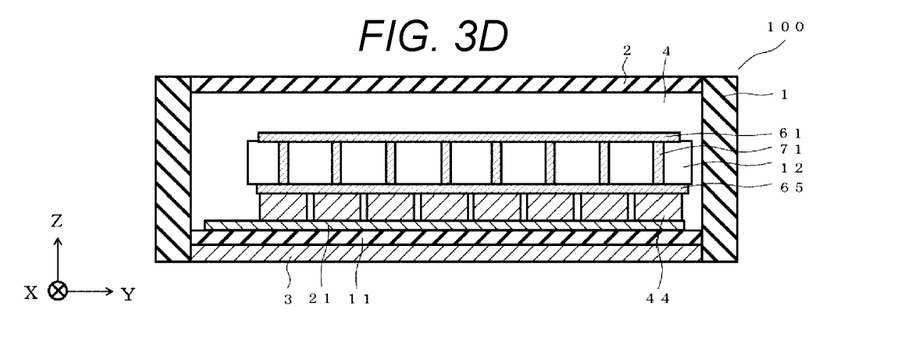
FIG. 3D is a cross-sectional view taken along line G-G' in FIG. 1B.
Figure 4:
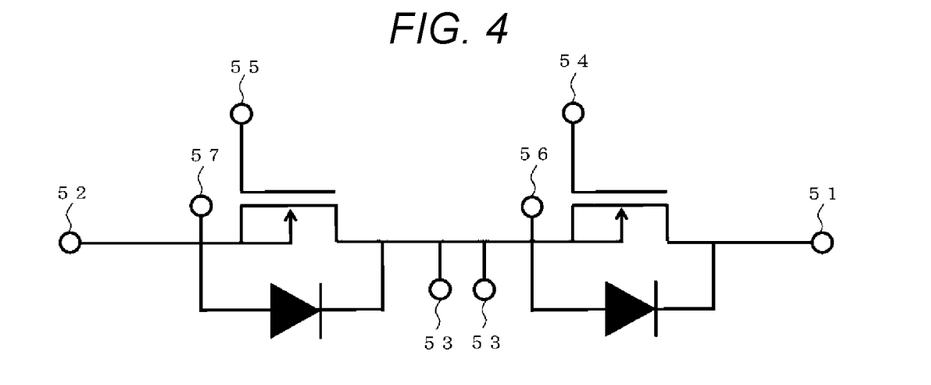
FIG. 4 illustrates an equivalent circuit of the semiconductor device according to the first embodiment.

FIG. 2A is a cross-sectional view taken along line A-A' in FIG. 1B. FIG. 2B is a cross-sectional view taken along line B-B' in FIG. 1B. FIG. 2C is a cross-sectional view taken along line C-C' in FIG. 1B. FIG. 3A is a cross-sectional view taken along line D-D' in FIG. 1B. FIG. 3B is a cross-sectional view taken along line E-E' in FIG. 1B. FIG. 3C is a cross-sectional view taken along line F-F' in FIG. 1B. FIG. 3D is a cross-sectional view taken along line G-G' in FIG. 1B. FIG. 4 illustrates an equivalent circuit of the semiconductor device 100 according to the first embodiment.

The semiconductor device 100 according to the first embodiment is a power semiconductor module, which is a power semiconductor device that is implemented as a component of another device. As illustrated in FIG. 4, the semiconductor device 100 according to the first embodiment is what is called a "2-in-1" module, which is a single module that makes up a half bridge circuit.

The semiconductor device 100 includes a resin case 1, a cover 2, a first substrate 11, the second substrate 12, a first metal layer 21, a second metal layer 22, a third metal layer 23, the first semiconductor element 30, the second semiconductor element 31, a first conductor layer 41, a second conductor layer 42, a third conductor layer 43, a fourth conductor layer 44, a fifth conductor layer 45, a first gate conductor layer 46, a second gate conductor layer 47, a first terminal 51, a second terminal 52, a third terminal 53, a first gate terminal 54, a second gate terminal 55, a first source sense terminal 56, and a second source sense terminal 57.

A direction from the first substrate 11 to the second substrate 12 will be referred to as Z direction (also referred to as the first direction). A direction orthogonal to the Z direction will be referred to as X direction (also referred to as the second direction), and a direction orthogonal to the X direction and the Z direction will be referred to as Y direction (also referred to as the third direction). FIGS. 1A and 1B are plan views of the semiconductor device 100 on an X-Y plane. FIG. 2A is a cross-sectional view of the semiconductor device 100 on an X-Z plane. FIGS. 2B, 2C, and 3A to 3D are cross-sectional views of the semiconductor device 100 on a Y-Z plane. It is noted that the X direction, the Y direction, and the Z direction, which are in orthogonal relationship in this embodiment, are not limited to orthogonal directions but may be directions intersecting one another. For convenience of description, a direction from the first substrate 11 to the second substrate 12 will be referred to as "upper" or "above", and a direction reverse to this direction will be referred to as "lower" or "below".

The first substrate 11 is an insulating substrate having a first surface and a second surface. The first metal layer 21, the second metal layer 22, and the third metal layer 23 are formed on the first surface of the first substrate 11. A heat dissipating sheet 3 is coupled to the second surface of the first substrate 11.

The resin case 1 forms a fence around the first substrate 11. The cover 2 is disposed on the resin case 1. Silicone gel 4 functioning as an encapsulating material is filled inside the resin case 1. The resin case 1, the cover 2, the first substrate 11, and the silicone gel 4 function to protect or insulate components in the semiconductor device 100.

The first metal layer 21, the second metal layer 22, and the third metal layer 23 are disposed apart from each other on the first surface of the first substrate 11. The second metal layer 22 is between the first metal layer 21 and the third metal layer 23 in the X direction. The first metal layer 21, the second metal layer 22, and the third metal layer 23 are formed of copper (Cu) sheets, for example.

The second substrate 12 is disposed on the first surface side of the first substrate 11 and apart from the first substrate 11 in the Z direction. The second substrate 12 includes a first wiring layer 61, a second wiring layer 62, a third wiring layer 63, a fourth wiring layer 64, a fifth wiring layer 65, a first gate wiring layer 66, a second gate wiring layer 67, a first source sense wiring layer 68, a second source sense wiring layer 69, a first via contact 71 (also referred to as the first connector), a second via contact 72 (also referred to as the second connector), a third via contact 73 (also referred to as the third connector), a fourth via contact 74 (also referred to as the fourth connector), a fifth via contact 75 (also referred to as the fifth connector), and a sixth via contact 76 (also referred to as the sixth connector).

As illustrated in FIGS. 1A, 2A to 2C, and 3D, the first wiring layer 61 is disposed on the second substrate 12 and located above the first metal layer 21. The first wiring layer 61 extends in the Y direction. As illustrated in FIGS. 2A and 3D, the fifth wiring layer 65 is disposed below the second substrate 12 and located between the first wiring layer 61 and the first metal layer 21. As illustrated in FIGS. 2A and 3D, a plurality of the first via contacts 71 are disposed inside the second substrate 12 between the first wiring layer 61 and the fifth wiring layer 65, and electrically connect the first wiring layer 61 and the fifth wiring layer 65 to each other.

As illustrated in FIGS. 1A, 2A, 3A, and 3B, the third wiring layer 63 is disposed on the second substrate 12 and located above the second metal layer 22 and the third metal layer 23. The third wiring layer 63 extends in the Y direction and is adjacent to the first wiring layer 61 in the X direction. As illustrated in FIGS. 2A and 3B, the fourth wiring layer 64 is disposed below the second substrate 12 and located above the second metal layer 22 and the third metal layer 23. As illustrated in FIG. 2A, the second via contact 72 is disposed inside the second substrate 12 between the third wiring layer 63 and the fourth wiring layer 64 and electrically connects the third wiring layer 63 and the fourth wiring layer 64 to each other. Although not illustrated, a plurality of the second via contacts 72 may be provided in the Y direction in a manner similar to the first via contacts 71.

As illustrated in FIGS. 2A, 2C, and 3C, the second wiring layer 62 is disposed below the second substrate 12 and located above the first metal layer 21 and the second metal layer 22. The second wiring layer 62 is located between the fourth wiring layer 64 and the fifth wiring layer 65 in the X direction. The second wiring layer 62 is spaced apart from the first wiring layer 61 in the Z direction. Part of the second wiring layer 62 is directly below part of the first wiring layer 61.

As illustrated in FIGS. 2A to 2C, the first gate wiring layer 66 is disposed on a level different from levels of the first wiring layer 61 and the second wiring layer 62 in the Z direction. Specifically, the first gate wiring layer 66 is disposed inside the second substrate 12 and extends in the Y direction.

As illustrated in FIGS. 2A, 3A, and 3B, the second gate wiring layer 67 is disposed on a level different from levels of the third wiring layer 63 and the fourth wiring layer 64 in the Z direction. Specifically, the second gate wiring layer 67 is disposed inside the second substrate 12 and extends in the Y direction. Inside the second substrate 12, the first gate wiring layer 66 and the second gate wiring layer 67 are adjacent to each other in the X direction.

As illustrated in FIGS. 2A to 2C, the first source sense wiring layer 68 is disposed on a level different from the levels of the first wiring layer 61 and the second wiring layer 62 in the Z direction. Specifically, the first source sense wiring layer 68 is disposed inside the second substrate 12 and extends in the Y direction.

As illustrated in FIGS. 2A, 3A, and 3B, the second source sense wiring layer 69 is disposed on a level different from the levels of the third wiring layer 63 and the fourth wiring layer 64 in the Z direction. Specifically, the second source sense wiring layer 69 is disposed inside the second substrate 12 and extends in the Y direction. Inside the second substrate 12, the first source sense wiring layer 68 and the second source sense wiring layer 69 are adjacent to each other in the X direction.

Although the first gate wiring layer 66 and the first source sense wiring layer 68 are between the first wiring layer 61 and the second wiring layer 62 in FIG. 2A, this should not be construed in a limiting sense insofar as the first gate wiring layer 66 and the first source sense wiring layer 68 are on levels different from the levels of the first wiring layer 61 and the second wiring layer 62. For example, the first gate wiring layer 66, the first source sense wiring layer 68, the first wiring layer 61, and the second wiring layer 62 may be disposed in this order from an upper side. Similarly, although the second gate wiring layer 67 and the second source sense wiring layer 69 are between the third wiring layer 63 and the fourth wiring layer 64 in FIG. 2A, this should not be construed in a limiting sense insofar as the second gate wiring layer 67 and the second source sense wiring layer 69 are on levels different from the levels of the third wiring layer 63 and the fourth wiring layer 64.

The first wiring layer 61, the second wiring layer 62, the third wiring layer 63, the fourth wiring layer 64, and the fifth wiring layer 65 are main wirings. The first gate wiring layer 66, the second gate wiring layer 67, the first source sense wiring layer 68, and the second source sense wiring layer 69 are signal wirings.

The first wiring layer 61, the second wiring layer 62, the third wiring layer 63, the fourth wiring layer 64, the fifth wiring layer 65, the first gate wiring layer 66, the second gate wiring layer 67, the first source sense wiring layer 68, and the second source sense wiring layer 69 are made of Cu, for example.

Figure 9:
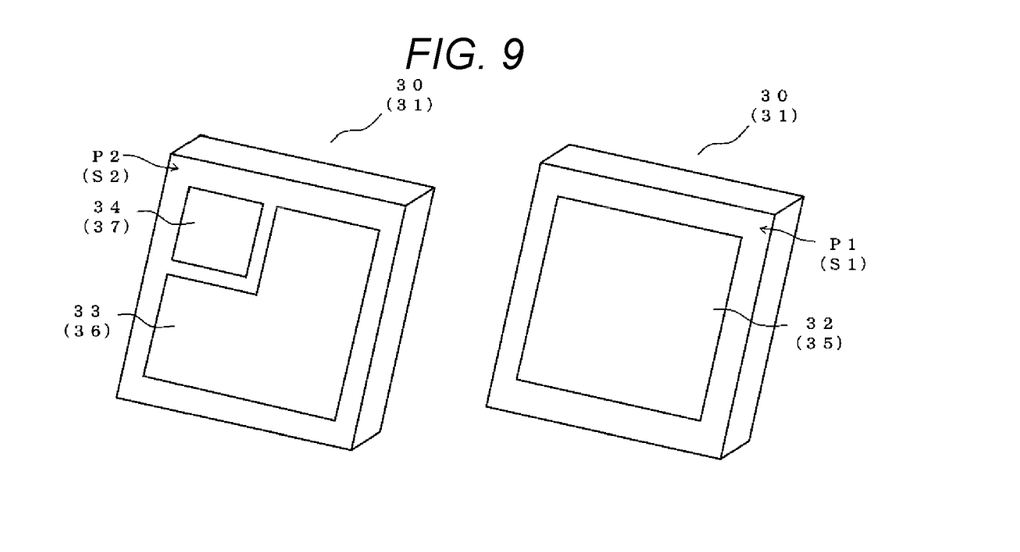
FIG. 9 is a perspective view of a front surface side and a rear surface side of a first semiconductor element or a second semiconductor element, included in the semiconductor device according to embodiments.

Next, description will be made on the first semiconductor element 30 and the second semiconductor element 31 respectively disposed on the first metal layer 21 and the second metal layer 22. FIG. 9 are perspective view of a front surface side and a rear surface side of the first semiconductor element 30 or the second semiconductor element 31.

The first semiconductor element 30 is between the first metal layer 21 and the second substrate 12. The first semiconductor element 30 is, for example, a vertical MOSFET. A first drain electrode 32 (also referred to as the first electrode) is formed on a lower surface P1 (also referred to as the first surface) of the first semiconductor element 30 in the Z direction. A first source electrode 33 (also referred to as the second electrode) and a first gate electrode 34 are formed on an upper surface P2 (also referred to as the second surface) of the first semiconductor element 30 in the Z direction. The first drain electrode 32 is electrically connected to the first metal layer 21. The first conductor layer 41 is disposed on the first source electrode 33. The first source electrode 33 and the second wiring layer 62 are electrically connected to each other with the first conductor layer 41. Since the second wiring layer 62 is electrically connected to the first source sense wiring layer 68 with the fifth via contact 75, the first source electrode 33 and the first source sense wiring layer 68 are electrically connected to each other. The first gate conductor layer 46 is disposed on the first gate electrode 34. The first gate electrode 34 and the first gate wiring layer 66 are electrically connected to each other with the first gate conductor layer 46 and the third via contact 73, which are electrically connected to each other.

The second semiconductor element 31 is between the second metal layer 22 and the second substrate 12. The second semiconductor element 31 is similar to the first semiconductor element 30 and is, for example, a vertical MOSFET. A second drain electrode 35 (also referred to as the third electrode) is formed on a lower surface S1 (also referred to as the first surface) of the second semiconductor element 31 in the Z direction. A second source electrode 36 (also referred to as the fourth electrode) and a second gate electrode 37 are formed on an upper surface S2 (also referred to as the second surface) of the second semiconductor element 31 in the Z direction. The second drain electrode 35 is electrically connected to the second metal layer 22. The second conductor layer 42 is disposed on the second source electrode 36. The second source electrode 36 and the fourth wiring layer 64 are electrically connected to each other with the second conductor layer 42. Since the fourth wiring layer 64 is electrically connected to the second source sense wiring layer 69 with the sixth via contact 76, the second source electrode 36 and the second source sense wiring layer 69 are electrically connected to each other. The second gate conductor layer 47 is disposed on the second gate electrode 37. The second gate electrode 37 and the second gate wiring layer 67 are electrically connected to each other with the second gate conductor layer 47 and the fourth via contact 74, which are electrically connected to each other.

The first semiconductor element 30 and the second semiconductor element 31 are made of material such as silicon (Si), silicon carbide (SiC) or gallium nitride (GaN).

The third conductor layer 43 is between the second wiring layer 62 and the second metal layer 22, and electrically connects the second wiring layer 62 and the second metal layer 22 to each other. That is, the first source electrode 33 of the first semiconductor element 30 is electrically connected to the second drain electrode 35 of the second semiconductor element 31 with the second wiring layer 62, the third conductor layer 43, and the second metal layer 22. A height of the third conductor layer 43 in the Z direction is substantially equal to a height between the first drain electrode 32 of the first semiconductor element 30, described later, and a boundary between the first conductor layer 41 and the second wiring layer 62.

The fourth conductor layer 44 is between the first metal layer 21 and the fifth wiring layer 65 and electrically connects the first metal layer 21 and the fifth wiring layer 65 to each other. The fifth wiring layer 65 is disposed below the second substrate 12. As described above, the first wiring layer 61 and the fifth wiring layer 65 are electrically connected to each other with the first via contacts 71. That is, the first wiring layer 61 and the first metal layer 21 are electrically connected to each other with the first via contacts 71, the fifth wiring layer 65, and the fourth conductor layer 44.

The fifth conductor layer 45 is between the third metal layer 23 and the fourth wiring layer 64, and electrically connects the third metal layer 23 and the fourth wiring layer 64 to each other. That is, the third metal layer 23 is electrically connected to the second source electrode 36 of the second semiconductor element 31.

The first metal layer 21, the second metal layer 22, the third metal layer 23, the first, second, third, fourth, and fifth wiring layers 61-65, the first gate wiring layer 66, the second gate wiring layer 67, the first source sense wiring layer 68, and the second source sense wiring layer 69 each extend in the Y direction. As depicted in FIGS. 1A to 3D, each of the following components is provided eight times in the Y direction: the first semiconductor element 30; the second semiconductor element 31; the first, second, third, fourth, and fifth conductor layers 41-45; the first gate conductor layer 46, the second gate conductor layer 47; and the first, second, third, fourth, fifth, and sixth via contacts 71-76.

Connection between each of the electrodes and each of the metal layers, connection between each of the electrodes and each of the conductor layers, and connection between each of the conductor layers and each of the wiring layers are made with solder (not illustrated), for example.

One end of the P power terminal 51 (also referred to as the first terminal) is exposed to an outside of the resin case 1, and the other end of the P power terminal 51 is electrically connected to the first wiring layer 61. One end of the N power terminal 52 (also referred to as the second terminal) is exposed to the outside of the resin case 1, and the other end of the N power terminal 52 is electrically connected to the third wiring layer 63. One end of the AC output terminal 53 (also referred to as the third terminal) is exposed to the outside of the resin case 1, and the other end of the AC output terminal 53 is electrically connected to the second metal layer 22.

One end of the first gate terminal 54 is exposed to the outside of the resin case 1, and the other end of the first gate terminal 54 is electrically connected to the first gate wiring layer 66. One end of the second gate terminal 55 is exposed to the outside of the resin case 1, and the other end of the second gate terminal 55 is electrically connected to the second gate wiring layer 67. One end of the first source sense terminal 56 is exposed to the outside of the resin case 1, and the other end of the first source sense terminal 56 is electrically connected to the first source sense wiring layer 68. One end of the second source sense terminal 57 is exposed to the outside of the resin case 1, and the other end of the second source sense terminal 57 is electrically connected to the second source sense wiring layer 69. The first source sense terminal 56 and the second source sense terminal 57 have source potentials, which serve as references at the time of applying voltages to the first gate electrode 34 and the second gate electrode 37.

A passive element may be connected to the first gate wiring layer 66 and the second gate wiring layer 67. The passive element provides resistance and capacitance, for example, for the purpose of minimizing noise of gate voltages.

Figure 5:
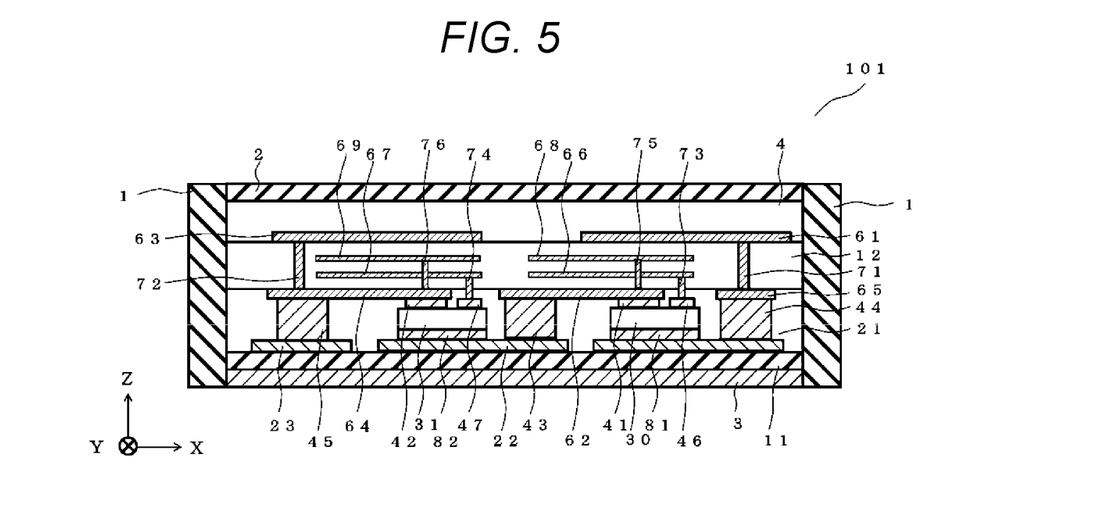
FIG. 5 is a cross-sectional view of a semiconductor device according to a modification of the first embodiment.

FIG. 5 is a cross-sectional view of a semiconductor device 101 according to a modification of the first embodiment. In the semiconductor device 101, a sixth conductor layer 81 may be interposed between the first drain electrode 32 and the first metal layer 21, and a seventh conductor layer 82 may be interposed between the second drain electrode 35 and the second metal layer 22. The rest of configuration of the semiconductor device 101 is substantially the same as the semiconductor device 100.

Figure 6:
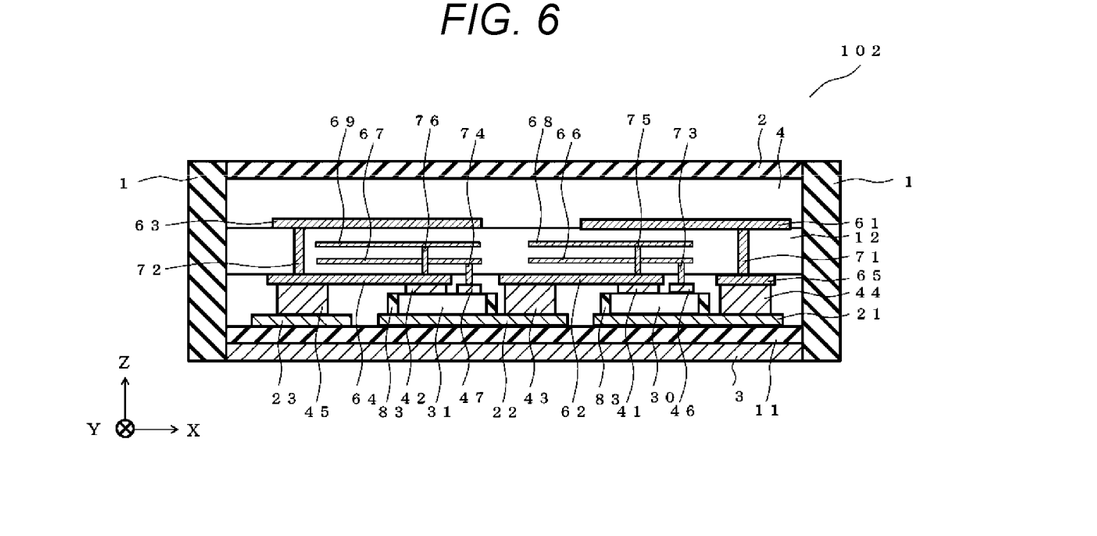
FIG. 6 is a cross-sectional view of a semiconductor device according to another modification of the first embodiment.

FIG. 6 is a cross-sectional view of a semiconductor device 102 according to another modification of the first embodiment. As illustrated in FIG. 6, the first semiconductor element 30 may be encapsulated with resin 83. Similarly, the second semiconductor element 31 may be encapsulated with the resin 83. The resin 83 is, for example, an epoxy resin. In FIG. 6, part of the resin 83 is made transparent to show the first semiconductor element 30 and the second semiconductor element 31 that are inside the resin 83.

Operation of Semiconductor Device 100

An operation of the semiconductor device 100 will be described.

A current input from the P power terminal 51 flows in the first wiring layer 61 in the X direction and the Y direction and reaches the first via contacts 71. Thereafter, the current passes through the first via contacts 71, the fifth wiring layer 65, the fourth conductor layer 44, and the first metal layer 21 in sequence and reaches the drain electrode of the first semiconductor element 30. When a voltage of the first gate electrode 34 is equal to or higher than a threshold voltage, the current flows in the first semiconductor element 30 vertically (in the Z direction), passes through the first source electrode 33 and the first conductor layer 41 in sequence, and reaches the second wiring layer 62. The current passes through the second wiring layer 62 in the X direction, flows in the third conductor layer 43 and the second metal layer 22, and thereafter reaches the AC output terminal 53. At this time, the X direction in which the current flows in the first wiring layer 61 is reverse to the X direction in which the current flows in the second wiring layer 62.

When a voltage of the second gate electrode 37 is equal to or higher than a threshold voltage, the current after reaching the AC output terminal 53 passes through the second metal layer 22, the second drain electrode 35, the second source electrode 36, and the second conductor layer 42 in sequence and flows in the fourth wiring layer 64 in the X direction. Thereafter, the current passes through the second via contact 72, passes through the third wiring layer 63 in the X direction and the Y direction, and is output from the N power terminal 52. At this time, the X direction in which the current flows in the fourth wiring layer 64 is reverse to the X direction in which the current flows in the third wiring layer 63.

Effects of First Embodiment

Figure 7:
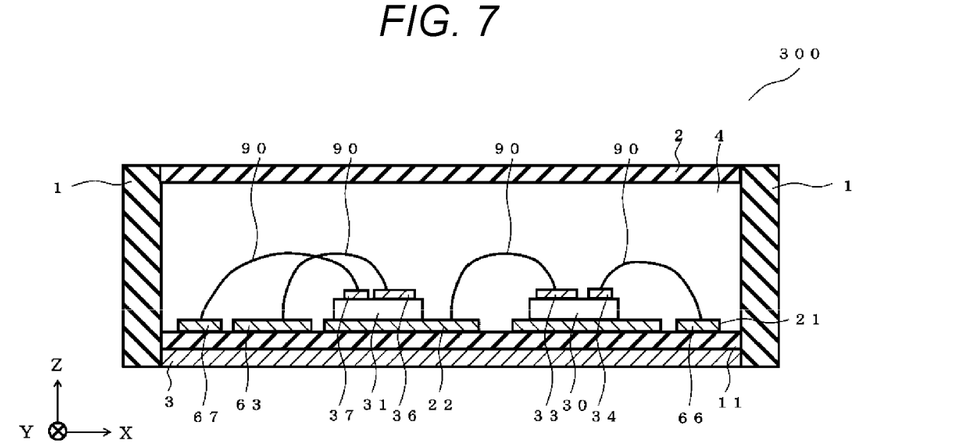
FIG. 7 is a cross-sectional view of a semiconductor device according to a comparative example.

Effects of the semiconductor device 100 according to the first embodiment will be described using a semiconductor device 300 according to a comparative example. FIG. 7 is a cross-sectional view of the semiconductor device 300 according to the comparative example. Components in common with the semiconductor device 100 according to the first embodiment are denoted with identical reference signs.

A configuration of the semiconductor device 300 according to the comparative example will be described. The semiconductor device 300 is different from the semiconductor device 100 according to the first embodiment in that the second substrate 12 is not provided, and that the third wiring layer 63, the first gate wiring layer 66, and the second gate wiring layer 67 are disposed on the first substrate 11. Connection between the first source electrode 33 and the second metal layer 22, connection between the first gate electrode 34 and the first gate wiring layer 66, connection between the second source electrode 36 and the third wiring layer 63, and connection between the second gate electrode 37 and the second gate wiring layer 67 are made with thin metal wire 90 using solder, for example.

The semiconductor device 300 according to the comparative example requires an area on the first substrate 11 where the third wiring layer 63, the first gate wiring layer 66, and the second gate wiring layer 67 are disposed.

In the semiconductor device 300 according to the comparative example, each of the electrodes and each of the wiring layers of the first semiconductor element 30 and the second semiconductor element 31 are connected with the thin metal wire 90 so that countercurrents of the wiring layers cannot produce a sufficient effect of canceling an induced electromotive force. Moreover, thinness of the thin metal wire 90 increases the induced electromotive force in the thin metal wire 90. A surge voltage generated when a semiconductor device is turned off is represented by a product of a current change rate and an inductance. In accordance with an increase in switching speed, the current change rate increases, and accordingly, the surge voltage increases. When the surge voltage exceeds a predetermined voltage, semiconductor elements may be damaged.

In contrast, in the semiconductor device 100 according to the first embodiment, the second substrate 12 is disposed above the first substrate 11, and the second substrate 12 is provided with the main wiring and the signal wiring. Therefore, as compared with the comparative example where some of the main wiring layers, and the signal wiring layers are disposed on the first substrate 11, an area on the first substrate 11 where the semiconductor elements are mounted is increased. In other words, the semiconductor device 100 according to the first embodiment can run a higher current per unit area than the semiconductor device 300 according to the comparative example.

As described above, the X direction in which the current flows in the first wiring layer 61 is reverse to the X direction in which the current flows in the second wiring layer 62. Similarly, the X direction in which the current flows in the fourth wiring layer 64 is reverse to the X direction in which the current flows in the third wiring layer 63. The first wiring layer 61 and the second wiring layer 62 face each other in the Z direction. The third wiring layer 63 and the fourth wiring layer 64 face each other in the Z direction. Consequently, an electromotive force induced at the time of operation of the semiconductor device 100 according to the first embodiment is canceled by the countercurrents in the reverse directions. Thus, the semiconductor device 100 can decrease a surge voltage at the time of switching so as to prevent damaging the semiconductor elements.

Moreover, a bonded interface between the second wiring layer 62 and the first conductor layer 41, a bonded interface between the second wiring layer 62 and the third conductor layer 43, a bonded interface between the fourth wiring layer 64 and the second conductor layer 42, a bonded interface between the fourth wiring layer 64 and the fifth conductor layer 45, and a bonded interface between the fifth wiring layer 65 and the fourth conductor layer 44 are located on an identical X-Y plane. Therefore, when the following connections are made with solder, for example, the connections can be simultaneously performed in a reflow furnace: connection between the first drain electrode 32 and the first metal layer 21; connection of the first source electrode 33 to the first conductor layer 41 and the second wiring layer 62; connection of the first gate conductor layer 46 to the first gate electrode 34 and the third via contact 73; connection between the second drain electrode 35 and the second metal layer 22; connection of the second source electrode 36 to the second conductor layer 42 and the fourth wiring layer 64; connection of the second gate conductor layer 47 to the second gate electrode 37 and the fourth via contact 74; connection of the third conductor layer 43 to the second metal layer 22 and the second wiring layer 62; connection of the fourth conductor layer 44 to the first metal layer 21 and the fifth wiring layer 65; and connection of the fifth conductor layer 45 to the third metal layer 23 and the fourth wiring layer 64. Consequently, when each of the electrodes and each of the wirings of the first semiconductor element 30 and the second semiconductor element 31 are connected with solder, for example, the semiconductor device 100 can reduce the number of manufacturing steps as compared with the semiconductor device 300 where pieces of the thin metal wire 90 are connected one by one using solder, for example.

Furthermore, the semiconductor device 100 according to the embodiment includes the third metal layer 23 and the fifth conductor layer 45. The third metal layer 23 and the fifth conductor layer 45 are provided to more efficiently dissipate heat generated when the semiconductor device 100 is turned on and operated. Provision of the third metal layer 23 and the fifth conductor layer 45 can make uniform a current distribution when the semiconductor device 100 is turned on and operated. However, provision of the third metal layer 23 and the fifth conductor layer 45 in the semiconductor device 100 is optional.

Second Embodiment

Configuration of Semiconductor Device 200

Figure 8:
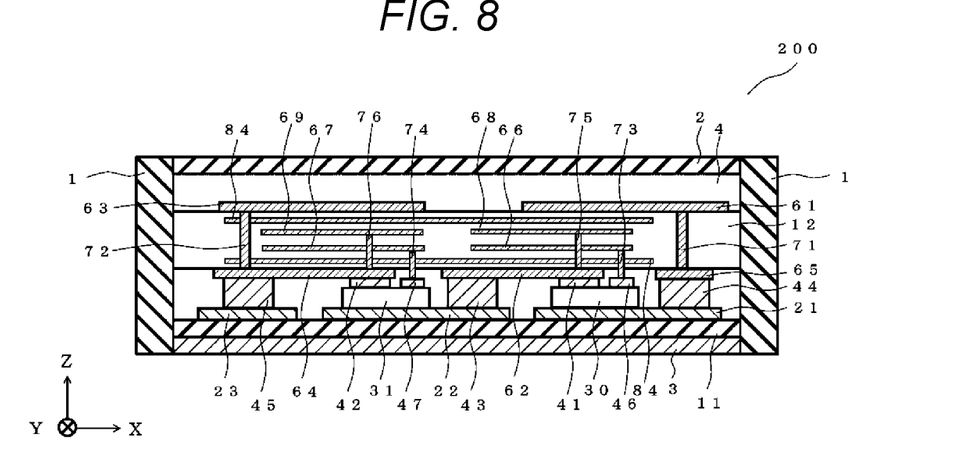
FIG. 8 is a cross-sectional view of a semiconductor device according to a second embodiment.

A semiconductor device 200 according to a second embodiment will be described with reference to FIG. 8. FIG. 8 is a cross-sectional view of the semiconductor device 200 according to the second embodiment. The cross-sectional view of FIG. 8 corresponds to a cross section taken along line A-A' in FIG. 1B.

The semiconductor device 200 according to the second embodiment is different from the semiconductor device 100 according to the first embodiment in that a shield layer 84 is disposed in the second substrate 12. More specifically, the shield layer 84 is interposed between the main wiring (i.e., the first wiring layer 61, the second wiring layer 62, the third wiring layer 63, the fourth wiring layer 64, and the fifth wiring layer 65) and the signal wiring (i.e., the first gate wiring layer 66, the second gate wiring layer 67, the first source sense wiring layer 68, and the second source sense wiring layer 69). The shield layer 84 is made of copper, for example, and has a floating potential. Description of aspects in common with the semiconductor device 100 according to the first embodiment has been omitted.

An amplitude of current that flows in the main wiring changes over time. A change in the amplitude of the current over time causes generation of electromagnetic noise and affects the signal wiring.

In the semiconductor device 200 according to the second embodiment, the shield layer 84 is interposed between the main wiring and the signal wiring. Consequently, the semiconductor device 200 can prevent the electromagnetic noise generated due to the current change in the main circuit from affecting the signal wiring layers, thereby eliminating or minimizing occurrence of a malfunction.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first substrate;
a first metal layer disposed on the first substrate;
a second metal layer disposed on the first substrate and spaced apart from the first metal layer;
a second substrate spaced apart from the first substrate in a first direction, and including a main wiring and a signal wiring;
a first semiconductor element disposed on the first metal layer;
a second semiconductor element disposed on the second metal layer;
a first terminal;
a second terminal;
a third terminal electrically connected to the second metal layer;
a first gate terminal;
a second gate terminal;
a first source sense terminal; and
a second source sense terminal,
the main wiring comprising:
a first wiring layer electrically connected to the first metal layer and the first terminal;
a second wiring layer electrically connected to the second metal layer;
a third wiring layer spaced apart from the first wiring layer and the second wiring layer, and electrically connected to the second terminal; and
a fourth wiring layer electrically connected to the third wiring layer,
the signal wiring comprising:
a first gate wiring layer on a level different from a level of the main wiring in the first direction and electrically connected to the first gate terminal;
a second gate wiring layer on a level different from the level of the main wiring in the first direction and electrically connected to the second gate terminal;
a first source sense wiring layer electrically connected to the first source sense terminal; and
a second source sense wiring layer electrically connected to the second source sense terminal,
the first semiconductor element comprising:
a first electrode electrically connected to the first metal layer and disposed on a first surface of the first semiconductor element;
a second electrode electrically connected to the second wiring layer and the first source sense wiring layer and disposed on a second surface of the first semiconductor element that is opposite to the first surface of the first semiconductor element; and
a first gate electrode electrically connected to the first gate wiring layer and disposed on the second surface of the first semiconductor element, and
the second semiconductor element comprising:
a third electrode electrically connected to the second metal layer and disposed on a first surface of the second semiconductor element;
a fourth electrode electrically connected to the fourth wiring layer and the second source sense wiring layer and disposed on a second surface of the second semiconductor element that is opposite to the first surface of the second semiconductor element; and
a second gate electrode electrically connected to the second gate wiring layer and disposed on the second surface of the second semiconductor element.

2. The semiconductor device according to claim 1, further comprising:
a first conductor layer between the second electrode and the second wiring layer;
a first gate conductor layer between the first gate electrode and the first gate wiring layer;
a second conductor layer between the fourth electrode and the fourth wiring layer;
a second gate conductor layer between the second gate electrode and the second gate wiring layer;
a third conductor layer between the second metal layer and the second wiring layer;
a fourth conductor layer electrically connected to the first wiring layer through a first connector; and
a fifth wiring layer disposed on the second substrate and between the first connector and the fourth conductor layer.

3. The semiconductor device according to claim 2, further comprising:
a third metal layer disposed on the first substrate and adjacent to the second metal layer in a second direction intersecting the first direction; and
a fifth conductor layer between the third metal layer and the fourth wiring layer.

4. The semiconductor device according to claim 3, further comprising:
a sixth conductor layer between the first electrode and the first metal layer; and
a seventh conductor layer between the third electrode and the second metal layer.

5. The semiconductor device according to claim 3, wherein a bonded interface between the second wiring layer and the first conductor layer, a bonded interface between the second wiring layer and the third conductor layer, a bonded interface between the fourth wiring layer and the second conductor layer, a bonded interface between the fourth wiring layer and the fifth conductor layer, and a bonded interface between the fifth wiring layer and the fourth conductor layer are located on an identical plane that is orthogonal to the first direction.

6. The semiconductor device according to claim 1, wherein a passive element is connected to the signal wiring.

7. The semiconductor device according to claim 1, wherein a current flows in the first wiring layer and in the second wiring layer in directions opposite to each other in the second direction, and a current flows in the third wiring layer and in the fourth wiring layer in directions opposite to each other in the second direction.

8. The semiconductor device according to claim 1, wherein part of the first wiring layer is directly above part of the second wiring layer in the first direction, and part of the third wiring layer is directly above part of the fourth wiring layer in the first direction.

9. The semiconductor device according to claim 1, further comprising a shield layer disposed in the second substrate between the main wiring and the signal wiring.

10. The semiconductor device according to claim 1, wherein each of the first and second semiconductor elements is encapsulated with resin on sides connecting the first and second surfaces thereof.

11. The semiconductor device according to claim 1, wherein
the semiconductor device comprises a plurality of the first semiconductor elements and a plurality of the second semiconductor elements,
the first gate wiring layer is connected to the first gate electrode of at least two of the first semiconductor elements,
the first source sense wiring layer is connected to the second electrode of at least two of the first semiconductor elements,
the second gate wiring layer is connected to the second gate electrode of at least two of the second semiconductor elements, and
the second source sense wiring layer is connected to the fourth electrode of at least two of the second semiconductor elements.

12. A semiconductor device comprising:
a first substrate having a first surface and a second surface opposed to the first surface;
a second substrate having a first surface and a second surface opposed to the first surface of the second substrate and spaced apart from the first substrate in a first direction that is perpendicular to the first and second surfaces of the first and second substrates;
a first metal layer on the second surface of the first substrate;
a second metal layer on the second surface of the first substrate and spaced apart from the first metal layer in a second direction;
a first wiring layer on the second surface of the second substrate and electrically connected to the first metal layer;
a second wiring layer on the first surface of the second substrate and electrically connected to the second metal layer;
a third wiring layer on the second surface of the second substrate and spaced apart from the first wiring layer in the second direction;
a fourth wiring layer on the first surface of the second substrate electrically connected to the third wiring layer;
a first gate wiring layer and a second gate wiring layer that are disposed in the second substrate between the first surface and the second surface of the second substrate;
a first source sense wiring layer and a second source sense wiring layer that are disposed in the second substrate between the first and second surfaces of the second substrate;
a first semiconductor element having a first surface and a second surface opposed to the first surface of the first semiconductor element and including a first electrode on the first surface thereof and electrically connected to the first metal layer, a second electrode on the second surface thereof and electrically connected to the second wiring layer and the first source sense wiring layer, and a first gate electrode on the second surface thereof and electrically connected to the first gate wiring layer;
a second semiconductor element having a first surface and a second surface opposed to the first surface of the second semiconductor element and including a third electrode on the first surface thereof and electrically connected to the second metal layer, a fourth electrode on the second surface thereof and electrically connected to the fourth wiring layer and the second source sense wiring layer, and a second gate electrode on the second surface thereof and electrically connected to the second gate wiring layer;
a first terminal electrically connected to the first wiring layer;
a second terminal electrically connected to the third wiring layer;
a third terminal electrically connected to the second metal layer;
a first gate terminal electrically connected to the first gate wiring layer;
a second gate terminal electrically connected to the second gate wiring layer;
a first source sense terminal electrically connected to the first source sense wiring layer; and
a second source sense terminal electrically connected to the second source sense wiring layer.

13. The semiconductor device according to claim 12, wherein a current flows in the first wiring layer and in the second wiring layer in directions opposite to each other in the second direction, and a current flows in the third wiring layer and in the fourth wiring layer in directions opposite to each other in the second direction.

14. The semiconductor device according to claim 12, further comprising a shield layer disposed in the second substrate between the first surface of the second substrate and the first and second gate wiring layers.

15. The semiconductor device according to claim 12, wherein each of the first and second semiconductor elements is encapsulated with resin on sides connecting the first and second surfaces thereof.

16. A semiconductor device comprising:
a first substrate having a first surface and a second surface opposed to the first surface;
a second substrate having a first surface and a second surface opposed to the first surface of the second substrate and spaced apart from the first substrate in a first direction that is perpendicular to the first and second surfaces of the first and second substrates;
a first metal layer on the second surface of the first substrate;
a second metal layer on the second surface of the first substrate and spaced apart from the first metal layer in a second direction;
a first wiring layer on the second surface of the second substrate and electrically connected to the first metal layer;
a second wiring layer on the first surface of the second substrate and electrically connected to the second metal layer;
a third wiring layer on the second surface of the second substrate and spaced apart from the first wiring layer in the second direction;
a fourth wiring layer on the first surface of the second substrate electrically connected to the third wiring layer;
a first gate wiring layer and a second gate wiring layer that are disposed in the second substrate between the first and second surfaces of the second substrate;
a first source sense wiring layer and a second source sense wiring layer that are disposed in the second substrate between the first and second surfaces of the second substrate;
a plurality of first semiconductor elements arranged on the first metal layer along a third direction crossing the first and second directions, each of the first semiconductor elements having a first surface and a second surface opposed to the first surface of the first semiconductor element and including a first electrode on the first surface thereof and electrically connected to the first metal layer, a second electrode on the second surface thereof and electrically connected to the second wiring layer and the first source sense wiring layer, and a first gate electrode on the second surface thereof and electrically connected to the first gate wiring layer;

a plurality of second semiconductor elements arranged on the second metal layer along the third direction, each of the second semiconductor elements having a first surface and a second surface opposed to the first surface of the second semiconductor element and including a third electrode on the first surface thereof and electrically connected to the second metal layer, a fourth electrode on the second surface thereof and electrically connected to the fourth wiring layer and the second source sense wiring layer, and a second gate electrode on the second surface thereof and electrically connected to the second gate wiring layer;

a first terminal electrically connected to the first wiring layer;

a second terminal electrically connected to the third wiring layer;

a third terminal electrically connected to the second metal layer;

a first gate terminal electrically connected to the first gate wiring layer;

a second gate terminal electrically connected to the second gate wiring layer;

a first source sense terminal electrically connected to the first source sense wiring layer; and a second source sense terminal electrically connected to the second source sense wiring layer.

17. The semiconductor device according to claim 16, wherein a current flows in the first wiring layer and in the second wiring layer in directions opposite to each other in the second direction, and a current flows in the third wiring layer and in the fourth wiring layer in directions opposite to each other in the second direction.

18. The semiconductor device according to claim 16, further comprising a shield layer disposed in the second substrate between the first surface of the second substrate and the first and second gate wiring layers.

19. The semiconductor device according to claim 16, wherein each of the plurality of first semiconductor elements and the plurality of second semiconductor elements is encapsulated with resin on sides connecting the first and second surfaces thereof.

20. The semiconductor device according to claim 16, wherein the first and second terminals are on the same side of the semiconductor device and spaced apart in the second direction and the third terminal is on an opposite side of the semiconductor device relative to the first and second terminals and spaced apart from the first and second terminals in the third direction.

* * * * *